United States Patent
Craig et al.

(10) Patent No.: US 7,476,608 B2
(45) Date of Patent: Jan. 13, 2009

(54) ELECTRICALLY CONNECTING SUBSTRATE WITH ELECTRICAL DEVICE

(75) Inventors: David M. Craig, Albany, OR (US); Chien-Hua Chen, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/181,479

(22) Filed: Jul. 14, 2005

(65) Prior Publication Data

US 2007/0015353 A1    Jan. 18, 2007

(51) Int. Cl.
*H01L 21/44* (2006.01)
*B23K 1/00* (2006.01)
*B23K 1/06* (2006.01)
*B23K 31/02* (2006.01)

(52) U.S. Cl. ............... 438/617; 228/1.1; 228/110.1; 228/180.5

(58) Field of Classification Search ............... 438/617; 257/784, 738, 786; 228/1.1, 110.1, 180.5
See application file for complete search history.

(56) References Cited

U.S. PATENT DOCUMENTS

| | | | |
|---|---|---|---|
| 4,418,858 A | 12/1983 | Miller | |
| 5,215,940 A | 6/1993 | Orcutt et al. | |
| 5,328,079 A * | 7/1994 | Mathew et al. | 228/180.5 |
| 5,961,029 A * | 10/1999 | Nishiura et al. | 228/180.5 |
| 6,457,235 B1 * | 10/2002 | Chuo et al. | 29/843 |
| 6,495,773 B1 * | 12/2002 | Nomoto et al. | 174/260 |
| 6,933,608 B2 * | 8/2005 | Fujisawa | 257/738 |
| 2002/0137327 A1 * | 9/2002 | Arakawa | 438/617 |
| 2003/0102358 A1 | 6/2003 | Bowen | |

FOREIGN PATENT DOCUMENTS

| | | |
|---|---|---|
| DE | 199 00 165 A1 | 7/1999 |
| EP | 1 422 014 A1 | 5/2004 |

OTHER PUBLICATIONS

Beni Nachon, "The Basics of Ball Bonding," K&S Technical Article, copyright 2004, www.kns.com.

* cited by examiner

Primary Examiner—Luan Thai

(57) ABSTRACT

A substrate is electrically connected with an electrical device mounted on the substrate. A ball bond is formed between a first end of a wire and a bonding pad of the substrate. A reverse-motion loop is formed within the wire. A bond is formed between a second end of the wire and a bonding pad of the electrical device.

12 Claims, 8 Drawing Sheets

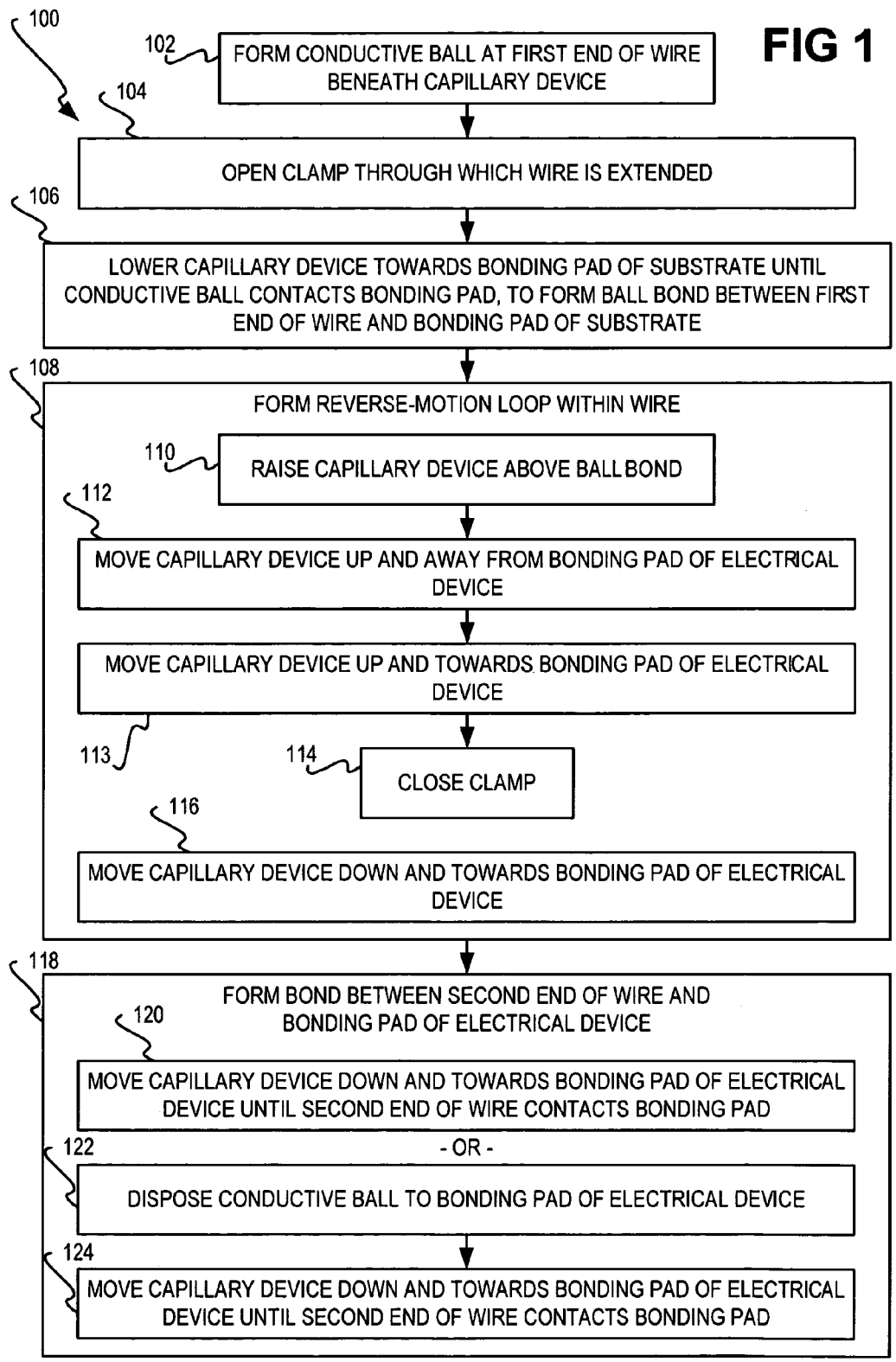

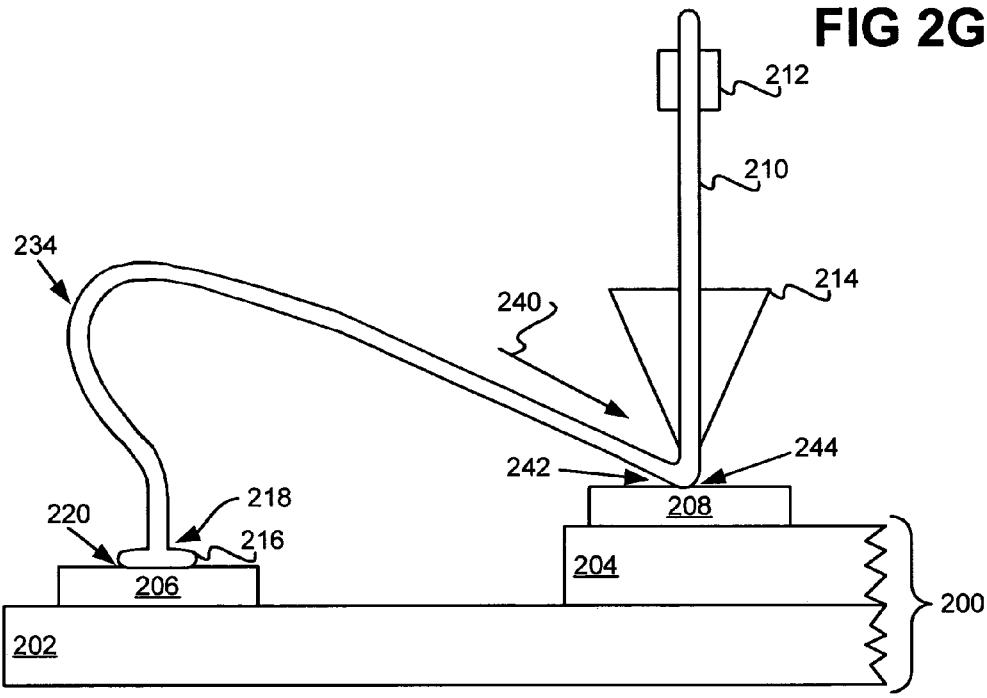
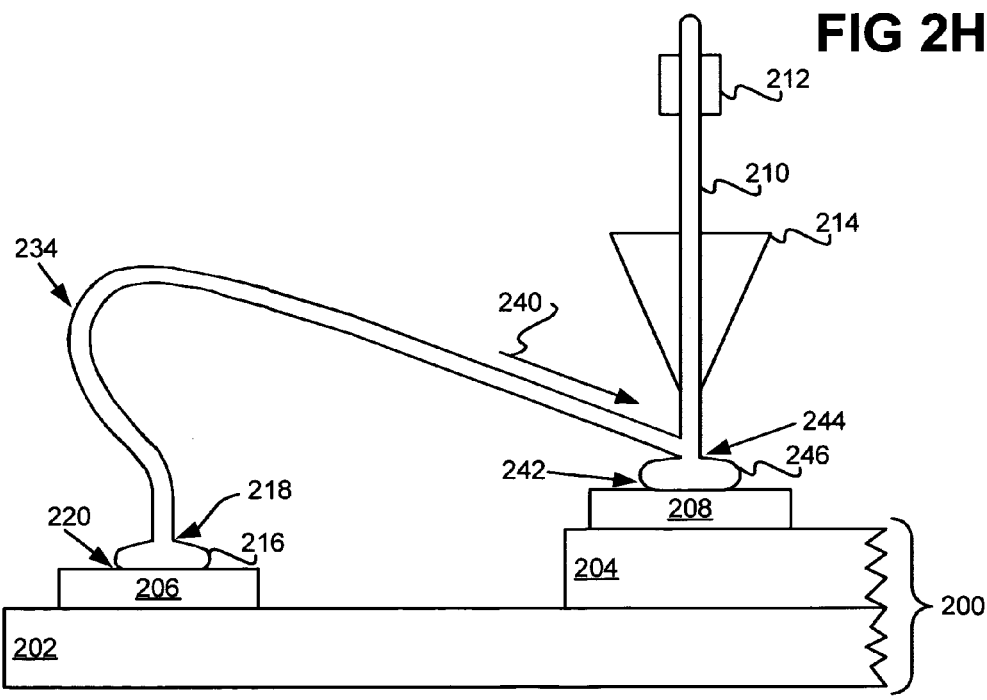

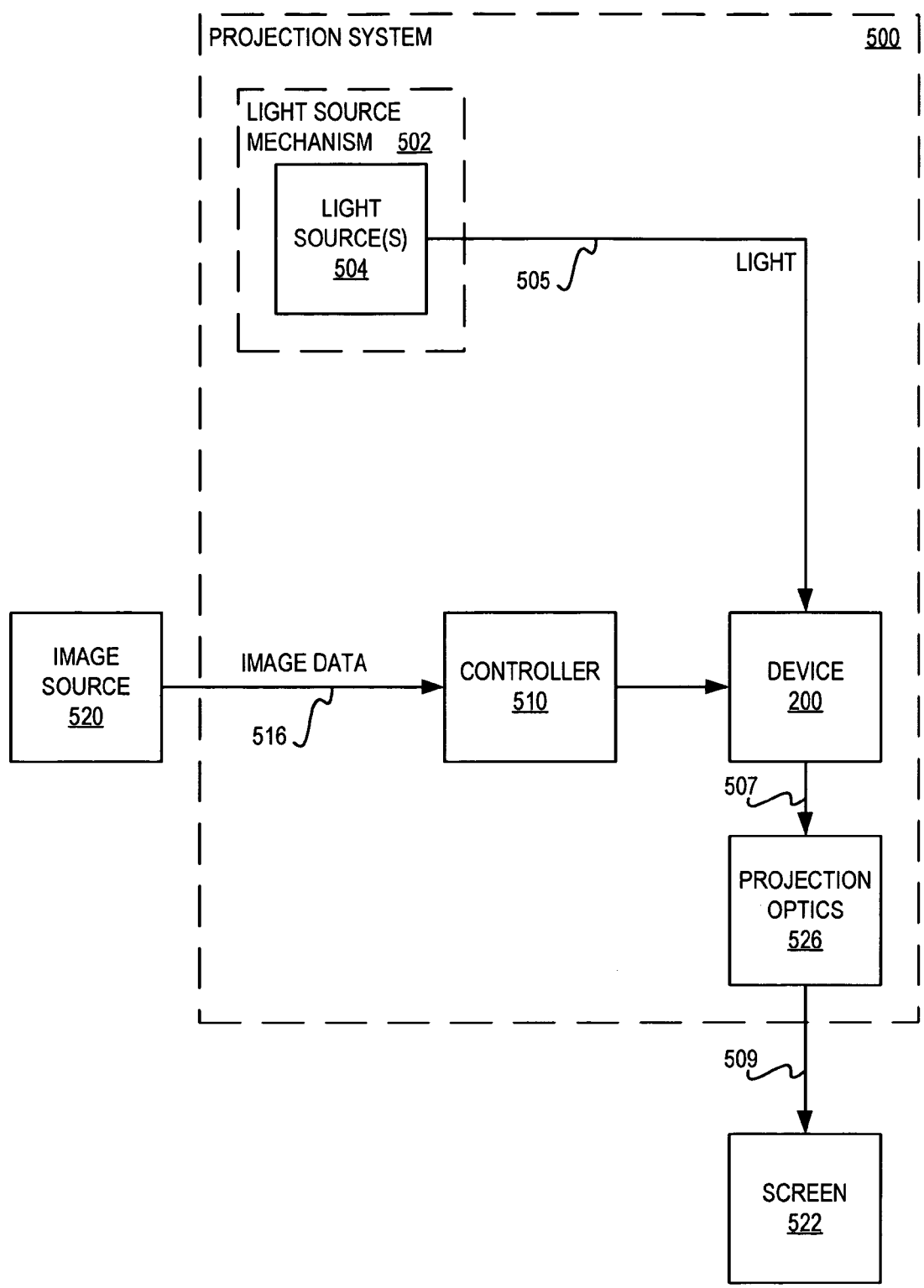

ELECTRICALLY CONNECTING SUBSTRATE WITH ELECTRICAL DEVICE

BACKGROUND

Micro electromechanical systems (MEMS) devices are devices that combine mechanical elements and electronic elements on a common substrate. MEMS devices are used in a wide variety of electronic devices. For example, many projectors employ a type of MEMS device known as a digital micromirror device (DMD). A DMD has a large number of very small mirrors that can be individually controlled to modulate light in accordance with image data, to assist in projecting a corresponding image on a screen.

A packaged semiconductor device that includes a MEMS device typically includes a substrate, such as a lead frame, on which the MEMS device is mounted. The MEMS device is usually electrically connected to the substrate using wire-bonding technology. Specifically, a ball bond is formed between a wire and a bonding pad of the MEMS device, a reverse-motion loop is created in the wire, and then another bond is formed between the wire and a bonding pad of the substrate. The reverse-motion loop in the wire may be needed to ensure the integrity and reliability of the wire bond.

The MEMS device itself includes a relatively thick upper portion, or lid, that maintains a sufficient pressure difference with the outside atmosphere so that the device properly functions. However, the thickness of the lid makes it difficult to form a proper wire bond between the MEMS device and the substrate. Specifically, the thickness of the lid makes it difficult to form the reverse-motion loop in the wire, without placing bond pads on the device further from the edge of the lid, which increases the cost of the device.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 1 is a flowchart of a method for electrically connecting a substrate of a packaged semiconductor device with an electrical device of the packaged semiconductor device that is mounted on the substrate, according to an embodiment of the invention.

FIGS. 2A-2H are diagrams illustratively depicting performance of the method of FIG. 1, according to an embodiment of the invention.

FIG. 5 is a block diagram of a type of an electronic device, particularly a projection system, that may employ a packaged semiconductor device, according to an embodiment of the invention.

DETAILED DESCRIPTION OF THE DRAWINGS

In the following detailed description of exemplary embodiments of the invention, reference is made to the accompanying drawings that form a part thereof, and in which is shown by way of illustration specific exemplary embodiments in which the invention may be practiced. These embodiments are described in sufficient detail to enable those skilled in the art to practice the invention. Other embodiments may be utilized, and logical, mechanical, electrical, electro-optical, software/firmware and other changes may be made without departing from the spirit or scope of the present invention. The following detailed description is, therefore, not to be taken in a limiting sense, and the scope of the present invention is defined only by the appended claims.

FIG. 1 shows a method 100 for electrically connecting a substrate with an electrical device, according to an embodiment of the invention. The substrate may in one embodiment be a lead frame for the electrical device, whereas the electrical device may in one embodiment be a micro electrical-mechanical systems (MEMS) device. The substrate and the electrical device may ultimately be part of a packaged semiconductor device, such as an integrated circuit (IC), or the MEMS equivalent of an IC. The method 100 thus may be the method by which such a packaged semiconductor device is formed at least in part. Parts of the method 100 are described, and then reference is made to exemplary illustrations of performance of the parts of the method 100.

The method 100 is specifically for electrically connecting a bonding pad of the substrate with a bonding pad of the electrical device via a wire bond. As such, a conductive ball is formed at a first end of the wire, beneath a capillary device through which the wire is also extruded (102), and a clamp through which the wire is extruded is opened (104). The clamp controls extrusion of the wire, and the wire is a conductive wire, such as gold or copper. The capillary device is a semiconductor fabrication tool that controls movement of the wire in a desired manner, as well as provides other functionality. For instance, the conductive ball may be formed at the first end of the wire by an electrical spark at the capillary device, which melts this end of the wire. This process of conductive ball formation is referred to as electronic flame off (EFO).

Figure 2A:
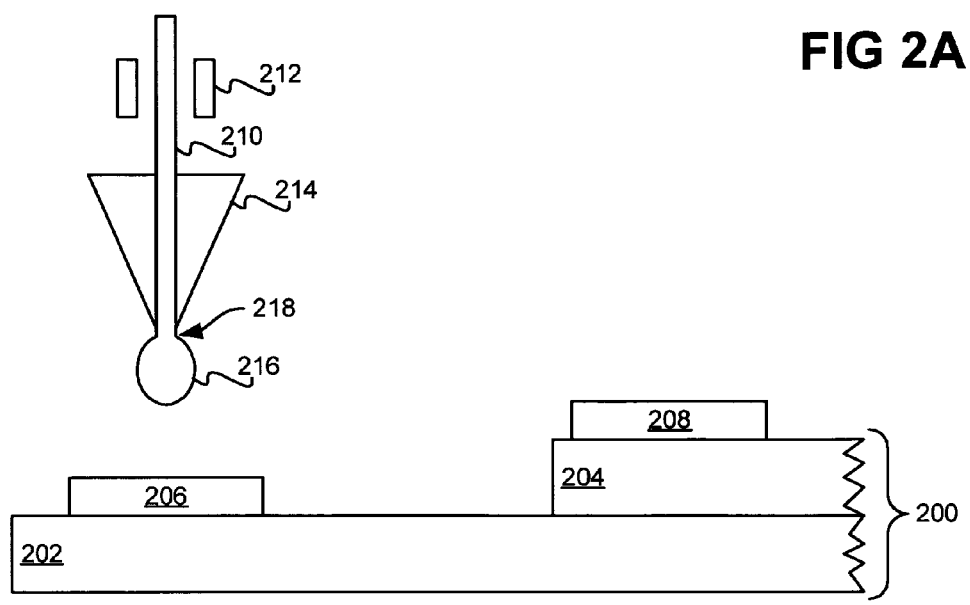

FIG. 2A shows exemplary performance of the parts 102 and 104 of the method 100 of FIG. 1, according to an embodiment of the invention. A packaged semiconductor device 200 includes a substrate 202, such as a lead frame, and an electrical device 204, such as a MEMS device. The substrate 202 includes a bonding pad 206, whereas the electrical device 204 includes a bonding pad 208. The bonding pad 208 of the electrical device 204 is depicted in FIG. 2A as being elevated in comparison to the bonding pad 206 of the substrate 202, but in other embodiments can be at the same level or below the bonding pad 206. Wire 210 is extruded through a clamp 212 and a capillary device 214. The clamp 212 is open, and a conductive ball 216 has been formed at a first end 218 of the wire 210.

Referring back to FIG. 1, the capillary device is lowered towards the bonding pad of the substrate until the conductive ball contacts the bonding pad, which forms a ball bond between the first end of the wire and the bonding pad of the substrate (106). Heat may be applied from under the substrate to assist in formation of the ball bond. Furthermore, ultrasonic vibration may be performed on the wire extruding through the capillary device to assist in formation of the ball bond.

Figure 2B:
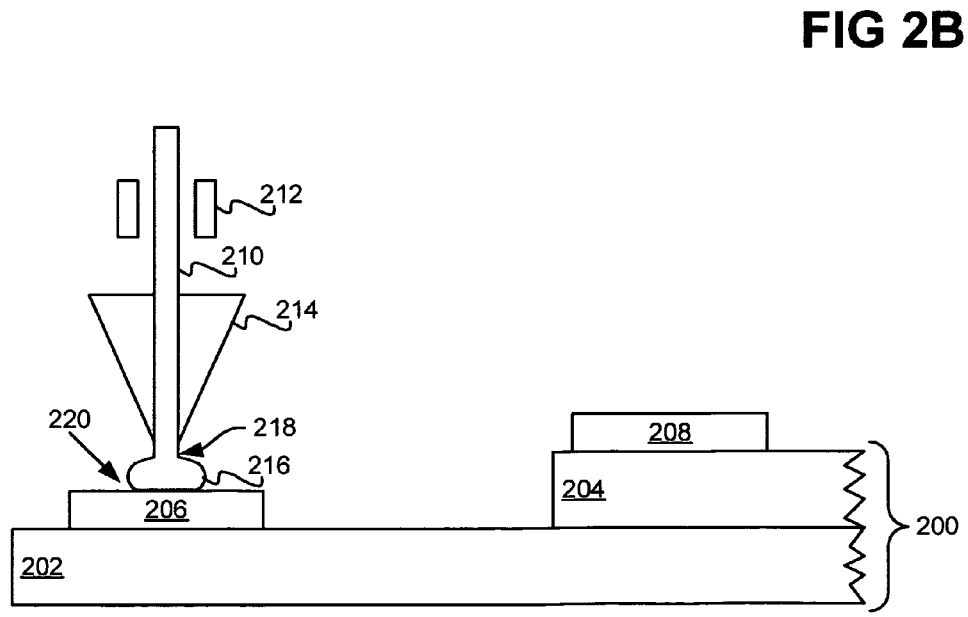

FIG. 2B shows exemplary performance of the part 106 of the method 100 of FIG. 1, according to an embodiment of the invention. The capillary device 214 has been lowered towards the bonding pad 206 of the substrate 202, such that the conductive ball 216 has made contact with the bonding pad 206, resulting in the formation of a ball bond 220 between the first end 218 of the wire 210 and the bonding pad 206. That is, the conductive ball 216 has been applied to the bonding pad 206 to result in the formation of the ball bond 220.

Referring back to FIG. 1, a reverse-motion loop is formed within the wire (108). The terminology "reverse-motion" describes how the wire is moved, such as by being controlled by the capillary device, to result in the formation of the loop. In one embodiment, the reverse-motion loop is formed by performing parts 110, 112, 114, and/or 116 of the method 100. The capillary device is raised above the ball bond that has been formed (110), such that the wire is raised above the ball bond. The capillary device is then moved up and away from the bonding pad of the electrical device (112), such that the wire is moved up and away from this bonding pad. The capillary device is further moved up and towards the bonding pad of the electrical device (113), such that the wire is moved up and towards this bonding pad. The clamp is closed (114), and the capillary device is moved up and towards the bonding pad of the electrical device (116), such that the wire is moved up and towards this bonding pad. The end result of these movements is the formation of a reverse-motion loop.

Figure 2C:
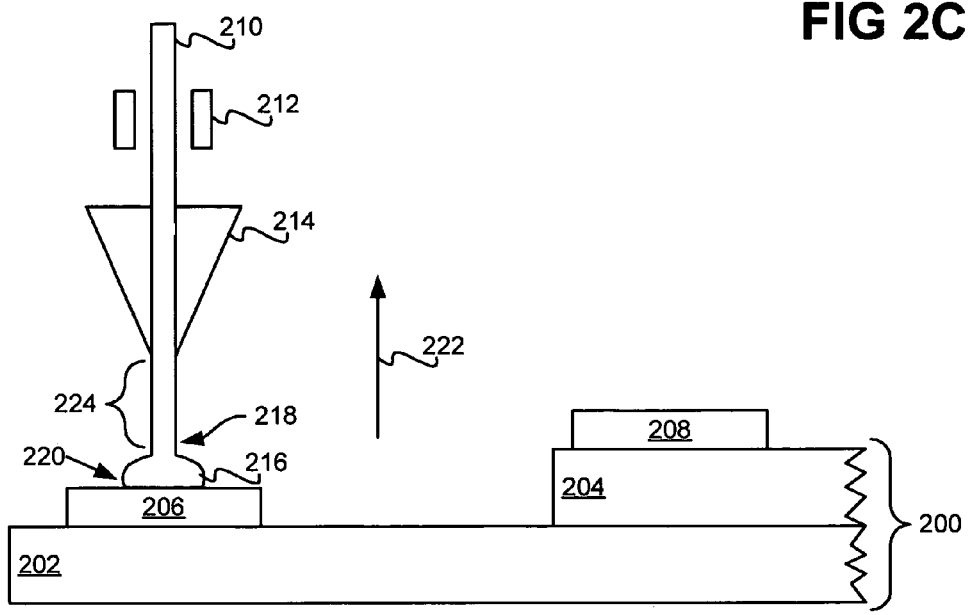
Figure 2D:
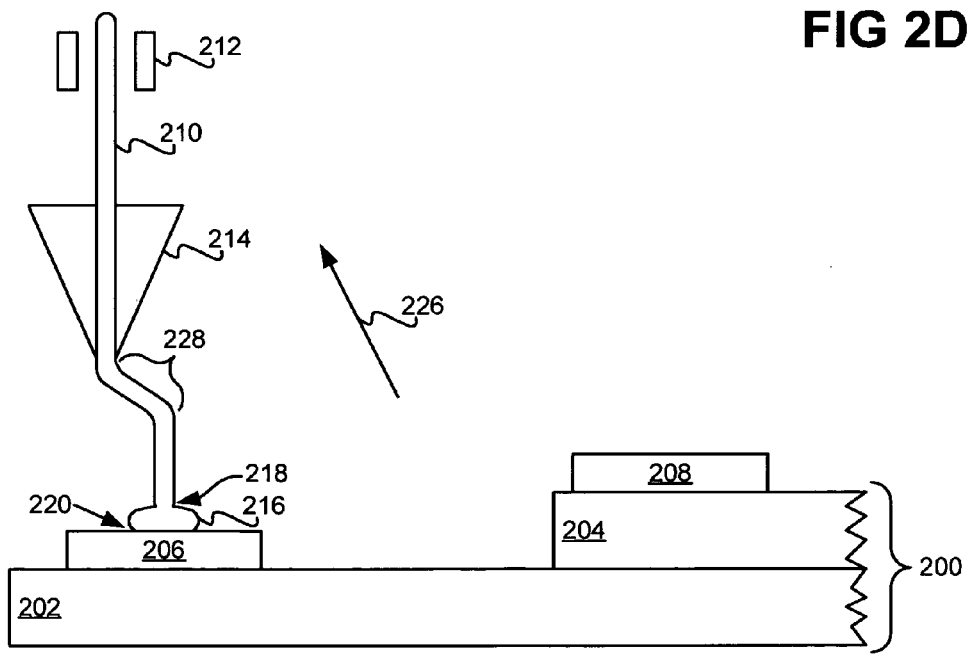

FIG. 2C shows exemplary performance of the part 110 of the method 100 of FIG. 1, according to an embodiment of the invention. The capillary device 214 is raised above the ball bond 220, as indicated by the arrow 222, such that the wire 210 is raised above the ball bond as indicated by the reference number 224. FIG. 2D shows exemplary performance of the part 112 of the method 100, according to an embodiment of the invention. The capillary device 214 is moved up and away from the bonding pad 208 of the electrical device 204, as indicated by the arrow 226, such that the wire 210 is moved up and away from the bonding paid 208 as indicated by the reference number 228. It is noted that movement up or down is in relation to the vertical axis of the figures, whereas movement towards or away is in relation to the horizontal axis of the figures.

Figure 2E:
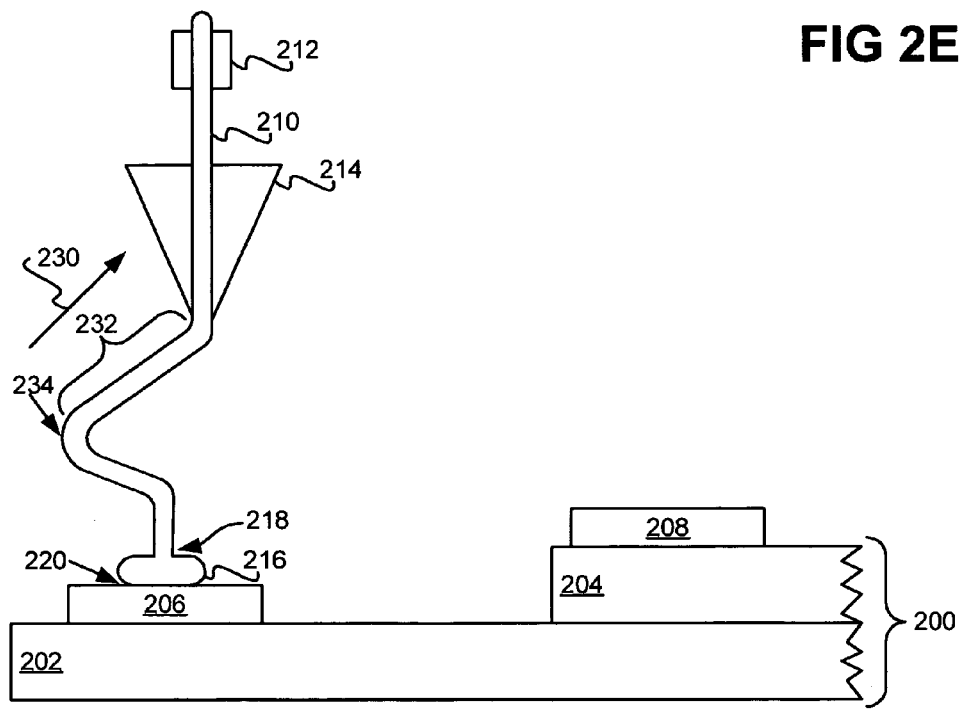

FIG. 2E shows exemplary performance of the parts 113 and 114 of the method 100 of FIG. 1, according to an embodiment of the invention. The capillary device 214 is moved up and towards the bonding pad 208 of the electrical device 204, as indicated by the arrow 230, such that the wire 210 is moved up and towards the bonding pad 208 as indicated by the reference number 232. The movement of the capillary device 214 and the wire 210 first up and away from the bonding pad 208, as in FIG. 2D, and then up and towards the bonding pad 208, as in FIG. 2E, results in the formation of a kink 234 within the wire 210.

The kink 234 is an indication of the reverse motion that the capillary device 214 and the wire 210 have performed. The motion is reverse in that the capillary device 214 and the wire 210 first move away from the bonding pad 208 of the electrical device 204, as in FIG. 2D, and then move towards the bonding pad 208, as in FIG. 2E. Once the capillary device 214 and the wire 210 move up and towards the bonding pad 208, FIG. 2E shows that the clamp 212 is closed on the wire 210, such that no additional wire is extruded through the clamp 212 and the capillary device 214.

Figure 2F:
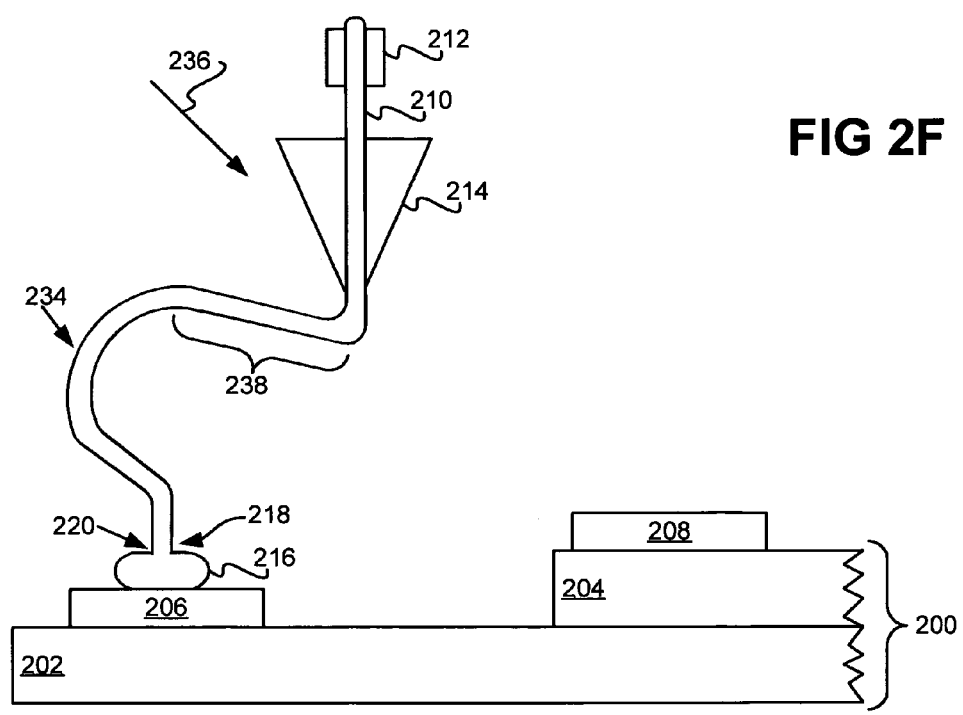

FIG. 2F shows exemplary performance of the part 116 of the method 100 of FIG. 1, according to an embodiment of the invention. The capillary device 214 is moved down and towards the bonding pad 208 of the electrical device 204, as indicated by the arrow 236, such that the wire 210 is moved down and towards the bonding pad 208 as indicated by the reference number 238. It is evident from FIG. 2F that a loop is thus being formed within the wire 210.

Referring back to FIG. 1, a bond is finally formed between a second end of the wire and the bonding pad of the electrical device (118). Formation of the bond may be performed in at least one of two different ways, such as by performing part 120 of the method 100, or by performing parts 122 and 124 of the method 100. In the first way, the capillary device is moved down and towards the bonding pad of the electrical device until the second end of the wire contacts the bonding pad (120), to form what is referred to as a stitch bond between the second end of the wire and the bonding pad of the electrical device. Heat may be applied from under the substrate to assist in formation of the stitch bond, as well as ultrasonic vibration on the wire extruding through the capillary device. It is noted that the movement of the capillary device in the part 120 of the method 100 may be considered an extension of its movement in the part 116 of the method 100.

In the second way of forming the bond, a conductive ball may have been previously disposed to the bonding pad of the electrical device (122). The conductive ball may be disposed to the bonding pad of the electrical device before the part 102 and/or the part 104 of the method 100 are performed. The capillary device is moved down and towards the bonding pad of the electrical device until the second end of the wire contacts the conductive ball (124). Such a bond is considered a stitch bond between the second end of the wire and the conductive ball, and is not a ball bond, in that the conductive ball is not situated at the end of the wire, as in the formation of the ball bond in the part 106 of the method 100, for example. Heat may again be applied from under the substrate to assist in formation of the stitch, as well as ultrasonic vibration on the wire extruding through the capillary device. It is noted that the movement of the capillary device in the part 124 of the method 100 may be considered an extension of its movement in the part 116 of the method 100.

FIGS. 2G and 2H show exemplary performance of the part 118 of the method 100 of FIG. 1, according to an embodiment of the invention. FIG. 2G specifically shows exemplary performance of the part 120 of the method 100, whereas FIG. 2H specifically shows exemplary performance of the parts 122 and 124 of the method 100. The capillary device 214 is moved down and towards the bonding pad 208 of the electrical device 204, as indicated by the arrow 240. In FIG. 2G, this movement continues until a second end 244 of the wire 210 contacts the bonding pad 208, resulting in the formation of a bond 242, such as a stitch bond, between the second end 244 of the wire 210 and the bonding pad 208 of the electrical device 204.

By comparison, in FIG. 2H, a conductive ball 246 is initially disposed or applied to the bonding pad 208 of the electrical device 204. The movement of the capillary device 214 downward and towards the bonding pad 208 continues until the second end 244 of the wire 210 contacts the conductive ball 246, resulting in the formation of the bond 242. In both FIGS. 2G and 2H, the reverse-motion loop that has been formed within the wire 210 is evident.

Figure 3A:
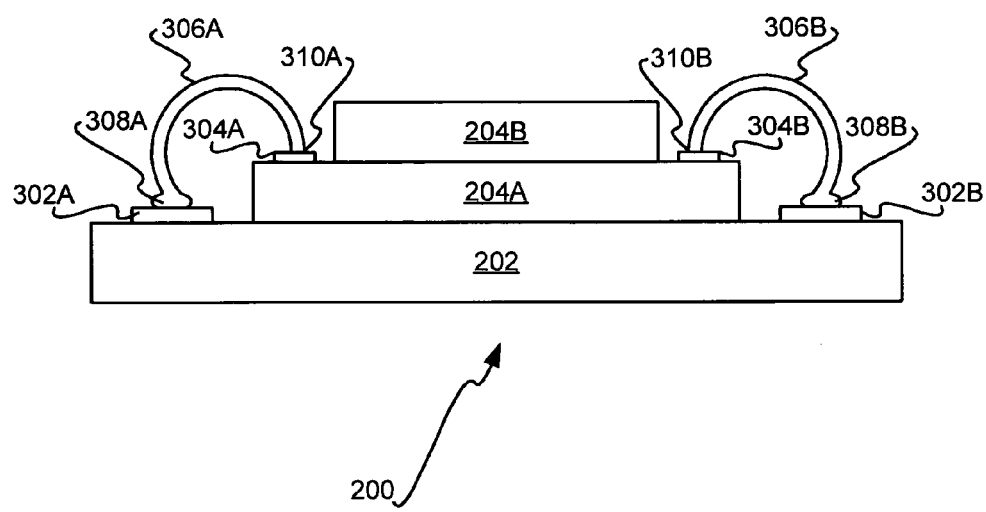
FIGS. 3A and 3B are cross-sectional front view diagrams of a packaged semiconductor device that includes a micro electromechanical systems (MEMS) device, according to different embodiments of the invention.
Figure 3B:
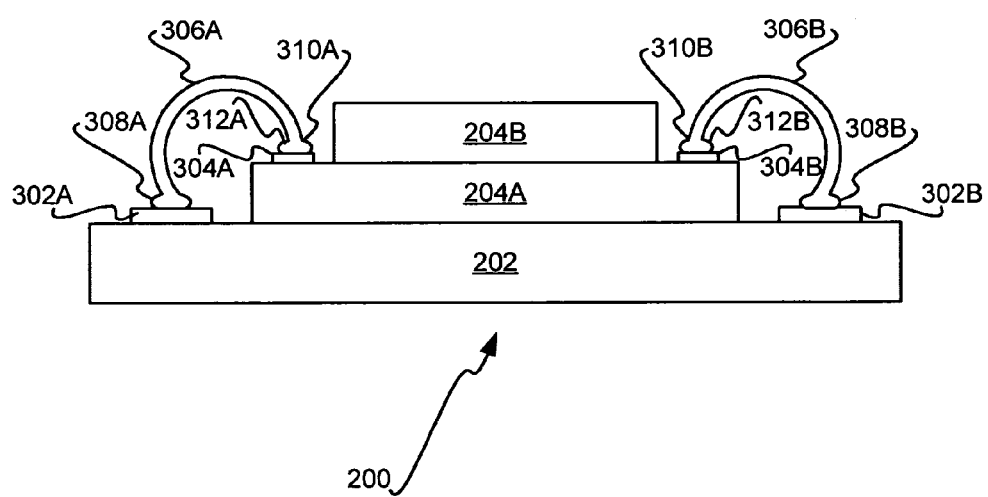

FIGS. 3A and 3B show a cross-sectional front view of the packaged semiconductor device 200 in which the electrical device 204 is specifically a MEMS device, according to varying embodiments of the invention. The electrical device 204 is mounted on the substrate 202, which has bonding pads 302A and 302B. The electrical device 204 includes a primary portion 204A having bonding pads 304A and 304B, and a lid portion 204B situated over or on the primary portion 204A. The primary portion 204A of the electrical device 204 contains the components that provide for the functionality of the electrical device 204, whereas the lid portion 204B maintains a sufficient pressure difference between the primary portion 204A and the outside atmosphere so that the primary portion 204A properly functions.

Wires 306A and 306B electrically connect or interconnect the bonding pads 302A and 302B of the substrate 202 with the bonding pads 304A and 304B of the electrical device 204. The wires 306A and 306B form ball bonds 308A and 308B with the bonding pads 302A and 302B. The wires 306A and 306B form stitch bonds 310A and 310B directly with the bonding pads 304A and 304B in FIG. 3A, and form stitch bonds 310A and 310B with conductive balls 312A and 312B applied to the bonding pads 304A and 304B in FIG. 3B.

The electrical connection of the wires 306A and 306B between the substrate 202 and the electrical device 204 is accomplished as has been described in relation to FIG. 1 and as has been shown in FIGS. 2A-2H. Specifically, the ball bonds 308A and 308B are first formed with the bonding pads 302A and 302B. Next the wires 306A and 306B are moved to form reverse-motion loops, as has been described, and finally the stitch bonds 310A and 310B are formed.

Forming the ball bonds 308A and 308B on the bonding pads 302A and 302B of the substrate 202, before forming the stitch bonds 310A and 310B on the bonding pads 304A and 304B of the electrical device 204, is advantageous. If ball bonds were instead first formed on the bonding pads 304A and 304B, for instance, the clearance between the bonding pads 304A and 304B on the primary portion 204A and the lid portion 204B of the electrical device 204 may be insufficient to allow reverse-motion loops to then be formed within the wires 306A and 306B. The lid portion 204B has a large enough thickness, or height, that moving a capillary device from the bonding pads 304A and 304B away from the bonding pads 308A and 308B—and thus towards the lid portion 204B—may not be able to accomplished. That is, the capillary device may hit up against the lid portion 204B when performing this reverse motion of the wires 306A and 306B, such that the reverse-motion loops within the wires 306A and 306B do not result in the wire bonds having sufficient integrity and reliability.

Therefore, initially forming the ball bonds 308A and 308B on the bonding pads 302A and 302B of the substrate 202, instead of initially forming ball bonds on the bonding pads 304A and 304B of the electrical device 204, allows the capillary device to fully perform its reverse motion of the wires 306A and 306B. The capillary device does not have any impediments to reverse motion after initially forming the ball bonds 308A and 308B on the bonding pads 302A and 302B of the substrate 202. By comparison, the capillary device does have an impediment to reverse motion if ball bonds were instead initially formed on the bonding pads 304A and 304B of the electrical device 204A, namely the lid portion 204B of the electrical device 204A.

Figure 4:
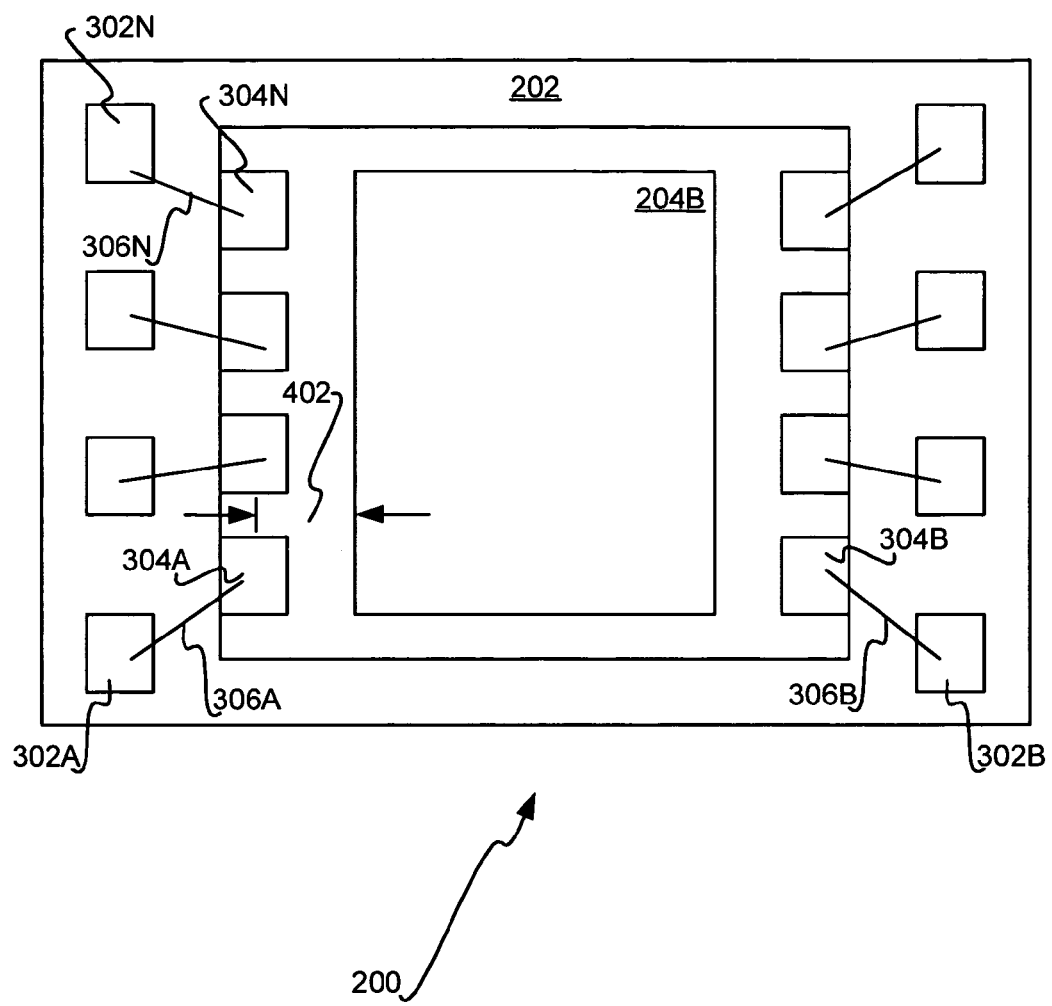
FIG. 4 is a top view diagram of the packaged semiconductor device of FIGS. 3A and 3B, according to an embodiment of the invention.

FIG. 4 shows a top view of the packaged semiconductor device 200 of FIG. 3, according to an embodiment of the invention. The electrical device 204 is again a MEMS device, having the primary portion 204A and the lid portion 204B, is mounted on the substrate 202, which may be a lead frame. The substrate 202 has bonding pads 302A, 302B, . . . , 302N, collectively referred to as the bonding pads 302. The electrical device 204 has bonding pads 304A, 304B, . . . , 304N, collectively referred to as the bonding pads 304, and which are on the primary portion 204A of the electrical device 204. The bonding pads 302 are electrically connected or interconnected to the corresponding bonding pads 304 via wires 306A, 306B, . . . , 306N, collectively referred to as the wires 306. Just eight of the bonding pads 302, the bonding pads 304, and the wires 306 are depicted in FIG. 4 for illustrative convenience, but in actuality there may be 16, 24, or more of the bonding pads 302, the bonding pads 304, and the wires 306.

Connecting the wires 306 between the bonding pads 302 of the substrate 202 and the bonding pads 304 of the electrical device 204 as has been described in relation to FIG. 1 allows the distance 402 between the horizontal center of the bonding pads 304 and the edge of the lid portion 204B of the electrical device 204 to be smaller. That is, if the wires 306 were instead connected between the bonding pads 302 and the bonding pads 304 such that bonds were initially formed at the bonding pads 304 of the electrical device 204, the needed reverse motion of the wires 306 using a capillary device would require greater clearance between the bonding pads 304 and the edge of the lid portion 204B. Because the reverse motion of the capillary device and the wires 306 occurs near the bonding pads 302 of the substrate 202, however, and not near the bonding pads 304 of the electrical device 204, the distance 402 can thus be smaller than it otherwise would have to be. Minimizing this distance 402 is advantageous, because it allows for a smaller packaged semiconductor device 200.

A packaged semiconductor device 200 having electrical connections between the bonding pads 302 of the substrate 202 and the bonding pads 304 of the electrical device 204 can be used in different types of electronic devices. For example, such an electronic device may include a controller that controls the packaged semiconductor device 200 to provide for a predetermined functionality. One such type of an electronic device is a projector, or another type of display device. The package semiconductor device 200 may in such instance include a light-modulating MEMS device as the electrical device 204. The controller modulates the MEMS device in accordance with image data, so that the image data may be projected or otherwise displayed for viewing by users.

FIG. 5 shows a block diagram of an example projection system 500, according to such an embodiment of the invention. The system 500 may be implemented as a projector. As can be appreciated by those of ordinary skill within the art the system 500 may include other components in addition to or in lieu of the components depicted in FIG. 5. The projection system 500 includes a light source mechanism 502 that includes light source(s) 504, a packaged semiconductor device 200, and projection optics 526. The packaged semiconductor device 200 includes an electrical device that is a light-modulating MEMS device, such as a digital micromirror device (DMD). The system 500 also includes a controller 510, and is operatively or otherwise coupled to an image source 520 to receive image data 516, as well as a screen 522.

The light source(s) 504 of the light source mechanism 502 output light, such as white light, as indicated by the arrow 505. Each of the light source(s) 504 may be an ultra high pressure (UHP) mercury vapor arc lamp, a xenon arc lamp, or another type of light source. For instance, the light source(s) may be other types of light bulbs, as well as other types of light sources such as light-emitting diodes (LED's), and so on. The light output by the light source(s) 504 is for ultimate modulation by the device 200, and for ultimate projection by the projection optics 526.

The controller 510 may be implemented in hardware, software, or a combination of hardware and software. The controller 510 receives image data 516 from an image source 520. The image source 520 may be a computing device, such as a computer, or another type of electronic and/or video device. The controller 510 controls the device 200 in accordance with a current frame of the image data 516. The device 200 thus modulates the light output by the light sources 504 in accordance with the image data 516 as controlled by the controller 510. The image data 516 may be a still image or a moving image, for instance.

This light is projected externally or outward from the projection system 500, as indicated by the arrow 507, through the projection optics 526, as indicated by the arrow 509, where it is displayed on the screen 522, or another physical object, such as a wall, and so on. The screen 522 may be a front screen or a rear screen, such that the projection system 500 may be a front-projection system or a rear-projection system, as can be appreciated by those of ordinary skill within the art. The user of the projection system 500, and other individuals able to see the screen 522, are then able to view the image data 516.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

We claim:

1. A method for electrically connecting a substrate with an electrical device mounted on the substrate, comprising:
    forming a ball bond between a first end of a wire and a bonding pad of the substrate;
    forming a reverse-motion loop within the wire by:
        raising the wire above the ball bond, while a clamp through which the wire is extruded is opened;
        moving the wire up and away from the bonding pad of the substrate while the clamp is opened;
        moving the wire up and towards the bonding pad of the electrical device while the clamp is opened;
        closing the clamp;
        moving the wire down and towards the bonding pad of the electrical device while the clamp is closed; and,
    forming a bond between a second end of the wire and a bonding pad of the electrical device while the clamp is closed.

2. The method of claim 1, wherein forming the ball bond between the first end of the wire and the bonding pad of the substrate comprises:
    forming a conductive ball at the first end of the wire; and,
    applying the conductive ball to the bonding pad of the substrate.

3. The method of claim 1, wherein forming the ball bond between the first end of the wire and the bonding pad of the substrate comprises:
    forming a conductive ball at the first end of the wire; and,
    moving a capillary device through which the wire is extruded towards the bonding pad of the substrate until the conductive ball contacts the bonding pad of the substrate.

4. The method of claim 1, wherein the wire is raised above the ball bond, moved up and away from the bonding pad of the substrate, moved up and towards the bonding pad of the electrical device, and moved down and towards the bonding pad of the electrical device by a capillary device through which the wire is extruded.

5. The method of claim 1, wherein forming the loop within the wire results in a kink being formed within the wire.

6. The method of claim 1, wherein forming the bond between the second end of the wire and the bonding pad of the electrical device comprises forming a stitch bond between the second end of the wire and the bonding pad of the electrical device.

7. The method of claim 1, wherein forming the bond between the second end of the wire and the bonding pad of the electrical device comprises moving a capillary device through which the wire is extruded towards the bonding pad of the electrical device until the second end of the wire contacts the bonding pad of the electrical device.

8. The method of claim 1, wherein forming the bond between the second end of the wire and the bonding pad of the electrical device comprises:
    disposing a conductive ball to the bonding pad of the electrical device; and,
    forming a bond between the second end of the wire and the conductive ball.

9. The method of claim 1, wherein forming the bond between the second end of the wire and the bonding pad of the electrical device comprises:
    disposing a conductive ball at the bonding pad of the electrical device; and,
    moving a capillary device through which the wire is extruded towards the bonding pad of the electrical device until the second end of the wire contacts the conductive ball disposed at the bonding pad of the electrical device.

10. A method comprising:
    for each of one or more first bonding pads of a substrate on which an electrical device is mounted, the electrical device having one or more second bonding pads corresponding to the first bonding pads,
        forming a conductive ball at a first end of the wire beneath a capillary device through which a wire is extruded;
        opening a clamp through which the wire is extruded;
        lowering the capillary device towards the first bonding pad until the conductive ball contacts the first bonding pad, resulting in a ball bond at the first bonding pad;
        raising the capillary device above the ball bond while the clamp is opened;
        moving the capillary device up and away from the second bonding pad while the clamp is opened;
        moving the capillary device up and towards the second bonding pad while the clamp is opened;
        closing the clamp;
        moving the capillary device down and towards the second bonding pad while the clamp is closed; and,
        forming a bond between a second end of the wire and the second bonding pad while the clamp is closed.

11. The method of claim 10, wherein forming the bond between the second end of the wire and the second bonding pad comprises moving the capillary device down and towards the second bonding pad until the second end of the wire contacts the second bonding pad.

12. The packaged semiconductor device method of claim 10, wherein forming the bond between the second end of the wire and the second bonding pad comprises:
    disposing a conductive ball to the second bonding pad; and,
    moving the capillary device down and towards the second bonding pad until the second end of the wire contacts the conductive ball.

* * * * *

UNITED STATES PATENT AND TRADEMARK OFFICE
CERTIFICATE OF CORRECTION

PATENT NO.            : 7,476,608 B2
APPLICATION NO.  : 11/181479
DATED                    : January 13, 2009
INVENTOR(S)         : David M. Craig et al.

It is certified that error appears in the above-identified patent and that said Letters Patent is hereby corrected as shown below:

In column 8, line 55, in Claim 12, after "The" delete "packaged semiconductor device".

Signed and Sealed this

Twenty-third Day of June, 2009

JOHN DOLL
*Acting Director of the United States Patent and Trademark Office*